United States Patent [19]

Kiely et al.

[11] Patent Number: 5,111,255
[45] Date of Patent: May 5, 1992

[54] BURIED CHANNEL HETEROJUNCTION FIELD EFFECT TRANSISTOR

[75] Inventors: Philip A. Kiely, Tinton Falls; Geoffrey W. Taylor, Holmdel, both of N.J.

[73] Assignee: AT&T Bell Laboratories, Murray Hill, N.J.

[21] Appl. No.: 533,636

[22] Filed: Jun. 5, 1990

[51] Int. Cl.$^5$ .................................... H01L 29/80
[52] U.S. Cl. ................................ 357/22; 357/16; 357/17; 372/45
[58] Field of Search ............... 357/22 A, 22 MD, 16, 357/17; 372/45

[56] References Cited

U.S. PATENT DOCUMENTS

| | | | |
|---|---|---|---|
| 4,558,337 | 12/1985 | Saunier et al. | 357/22 A |
| 4,590,502 | 5/1986 | Morkoc | 357/22 A |
| 4,686,550 | 8/1987 | Capasso et al. | |
| 4,800,415 | 1/1989 | Simmons et al. | |
| 4,806,997 | 2/1989 | Simmons et al. | |
| 4,814,836 | 3/1989 | Thompson | 357/22 A |
| 4,860,068 | 8/1989 | Gossard et al. | 357/22 A |
| 4,862,228 | 8/1989 | Ralph | 357/22 A |

FOREIGN PATENT DOCUMENTS

| | | | |
|---|---|---|---|
| 59-63770 | 4/1984 | Japan | 357/22 MD |
| 59-111371 | 6/1984 | Japan | 357/22 MD |
| 60-12775 | 1/1985 | Japan | 357/22 MD |
| 60-35577 | 2/1985 | Japan | 357/16 |
| 63-318782 | 12/1988 | Japan | 357/22 A |
| 1-128473 | 5/1989 | Japan | 357/22 A |

OTHER PUBLICATIONS

IEEE Transactions on Electron devices, vol. 37, No. 6, Jun. 1990, "An AlGaAs/In, Ga$_{1-z}$As/AlGaAs (O≦x≦0.5) Pseudomorphic HEMT on GaAs Substrate Using an In$_2$Ga$_{1-2}$As Buffer Layer" by Maezawa et al., pp. 1416-1421.
Conference: Integrated and Guided-Wave Optics Technical Digest (28-30 Jan. 1980), "Monolithic Integration of a GaAlAs Injection Laser with a Schottky--Gate FET" by Fukuzawa et al. WC3/1-3.
Fujii, T., et al., "MBE growth of extremely high-quality GaAs-AlGaAs Grinsch lasers with a superlattice buffer layer", J. Vac. Sci. Technol. B., vol. 3, No. 2, Mar./Apr. 1985, pp. 776-778.
Zuleeg, R., et al., "Double Implanted GaAs . . . ", IEEE Electron Device Letters, vol. EDL-5, No. 1, Jan. 1984, pp. 21-23.
Daniels, R. R., et al., "Complementary Heterostructure . . .", IEDM Tech. Digest, Dec. 1986, pp. 448-451.
Taylor, G. W., et al., "Very High-Transconductance Heterojunction . . . ", Electronics Letters, vol.23, No. 2, Jan. 16, 1987, pp. 77-79.
Makoto, et al., "Device Characterization of p-Channel . . . ", IEEE Transactions On Electron Devices, vol. ED-34, No. 12, Dec. 1987, pp. 2399-2404.
Del Alamo, J. A., et al., "An In$_{0.52}$. . . ", IEEE Electron Device Letters, vol. 10, No. 8, Aug. 1989, pp. 394-396.
Kiehl, R. A., et al., "Complementary p- and n-. . . ", IEDM EDL, vol. 9, No. 6, Jun. 1988, pp. 684-687.
Taylor, G. W., et al., "Heterojunction Field-Effect . . . ", Electronics Letters, vol. 22, No. 15, Jul. 17, 1986, pp. 784-786.
Yoh, K., et al., "Complementary Modfet Circuits . . . ", IEDM Tech. Digest, Dec., 1987, pp. 892-894.
Derry, P. L. et al., "Ultralow threshold graded-index . . .", J. Vac. Sci. Technol. B 6 (2), Mar./Apr. 1988, pp. 689-691.

Primary Examiner—Rolf Hille
Assistant Examiner—Steven Loke
Attorney, Agent, or Firm—Richard D. Laumann

[57] ABSTRACT

A high transconductance field effect transistor is realized by controlling the doping level in a conducting channel buried beneath a heterointerface. In one exemplary embodiment, a channel comprising an undoped, high mobility, narrow band gap quantum well in combination with an intermediate band gap layer is formed beneath a heterointerface. The heterojunction interface is between a wide band gap layer and the quantum well region. A charge sheet having the same conductivity type as the wide bandgap layer is formed near the heterointerface. Advantageously, the transconductance is enhanced by conduction in the undoped filled quantum well region.

19 Claims, 3 Drawing Sheets

BURIED CHANNEL HETEROJUNCTION FIELD EFFECT TRANSISTOR

This invention was made with Government support under contract No. DASG60-88-C-0044 awarded by United States of America Strategic Defense Command. The Government has certain rights in this invention.

TECHNICAL FIELD

This invention relates to the field of semiconductor heterojunction devices and, more particularly, to field effect transistors having a heterointerface.

CROSS-REFERENCE TO RELATED APPLICATION

This application is related to United States patent application Ser. No. 533,549 (P. Cooke Case 1-6), which was filed concurrently herewith.

BACKGROUND OF THE INVENTION

Considerable interest has recently centered on the development of III-V semiconductor complementary integrated circuits because of their potential for high speed, low power dissipation and large noise margin. See, for example, K. Yoh et al., *IEDM Digest*, pp. 892-94 (1987). Most of this effort to date has been reported on n- and p-channel heterostructure insulated gate field effect transistors (HIGFETs). See, R. R. Daniels et al., *IEDM Tech. Digest*, pp. 448-51 (1986), M. Hiraro et al., *IEEE Trans. Electron Devices*, Vol. ED-34, No. 12, pp. 2399-2404 (1987) and M. D. Feuer, et al, *DRC Tech. Digest*, IV B-2, June, 1989. Specifically, the prior art discloses the utilization of undoped epitaxially grown semiconductor layers in order to eliminate threshold voltage variations. Unfortunately, the threshold voltage is then critically dependent on the semiconductor material used and, consequently, is difficult to alter by design. Furthermore, because the long channel threshold voltage is essentially fixed, the decrease in threshold voltage for short channel devices cannot be compensated by design. Thus, a minimum gate length is typically required to control the threshold voltage which, in turn, limits the transconductance and device speed.

SUMMARY OF THE INVENTION

A field effect transistor avoiding the problems of the prior art is realized by controlling the doping in a conducting channel located beneath a heterointerface. The channel may comprise either a narrow bandgap semiconductor region, or a quantum well in combination with an intermediate bandgap region. Specifically, in the simple non-quantum well form, conduction takes place in the narrow bandgap channel wherein the conductivity is controlled by the voltage bias to an ohmic gate contact, whereas in the quantum well case, the device operation is similar except that carrier accumulation may occur in the undoped quantum well, which enhances the channel conduction.

In a exemplary embodiment, a buried channel comprising a narrow bandgap InGaAs quantum well and an intermediate bandgap AlGaAs layer, is disposed beneath the heterointerface of the InGaAs single quantum well and a wide bandgap AlGaAs layer. At the heterointerface, a thin charge sheet having the same conductivity type as the wide bandgap layer is placed. As the gate voltage approaches its maximum value, an accumulation of carriers in the quantum well may occur.

Additionally, with the formation of a suitable optical cavity, a laser may be fabricated which incorporates the exemplary structure of the field effect transistor above. Moreover, by forward biasing the device, electrons may be pumped into the quantum well via collector and gate terminals, resulting in lasing action.

BRIEF DESCRIPTION OF THE DRAWING

A more complete understanding of the invention may be obtained by reading the following description in conjunction with the appended drawing in which.

DETAILED DESCRIPTION

The invention provides a field effect transistor that utilizes a narrow bandgap buried channel situated just below a heterojunction interface between a wide bandgap layer and a narrow bandgap layer. On both sides of the buried channel the semiconductor layers are of opposite conductivity type to that of the channel. Advantageously, the buried channel allows lateral conduction to take place therein such that an ohmic gate contact thereto controls the depletion of the buried channel, resulting in source-drain modulation. It should be noted that, if an undoped quantum well is introduced just below the heterointerface, enhanced transconductance may be achieved due to carrier accumulation. For the latter embodiment of the device, the doped buried channel region must be grown in some intermediate bandgap layer. In addition, the semiconductor layer below the channel region is a wide bandgap semiconductor, specifically, the same as the wide bandgap semiconductor above the channel. The high mobility afforded by an accumulated interface under an applied gate bias provides the desirable performance characteristics associated with the high electron mobility transistor (HEMT). As described in the proceeding section, the device further provides the benefits of low gate leakage current, self-aligned source/drain, as well as the potential for submicron scaling.

Figure 1:
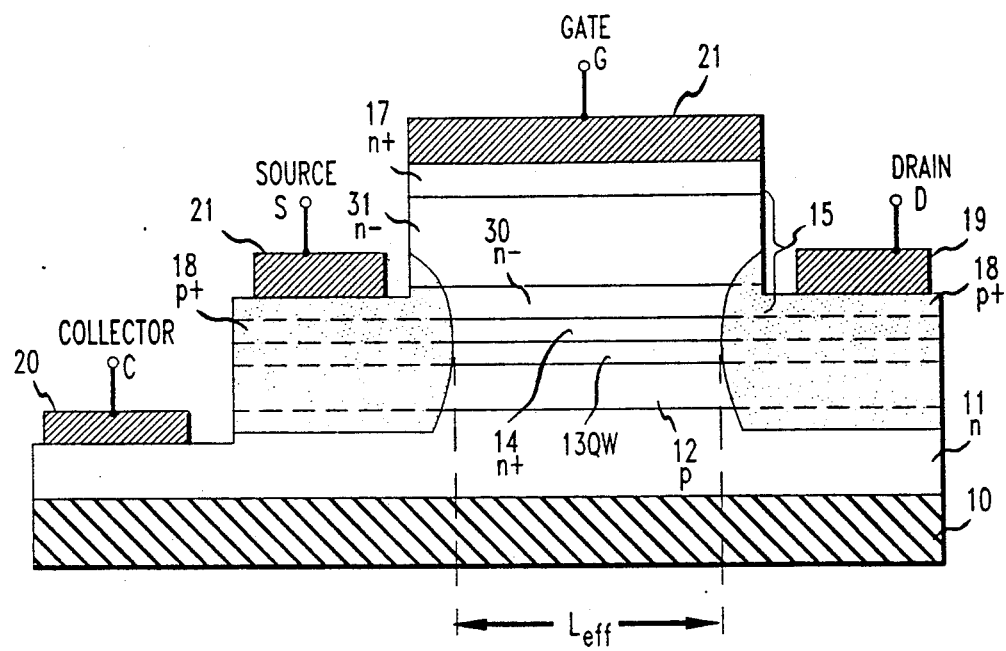
FIG. 1 is a front sectional view of a p-channel field effect transistor in accordance with the principles of the invention.

One exemplary embodiment of a device utilizing a quantum well region in accordance to our invention is depicted in FIG. 1. The device comprises a semi-insulating substrate 10, a wide bandgap layer 11, intermediate bandgap layer 12, undoped narrow bandgap quantum well 13 and wide bandgap region 15. For the sake of clarity, a buffer wide bandgap layer, disposed between wide bandgap layer 11 and semi-insulating substrate 10, is not shown. Wide bandgap region 15 comprises fairly low doped layers 30 and 31. Near the interface between wide bandgap region 15 and quantum well 13, there is a highly doped thin layer 14. This highly doped layer controls the depletion of the channel region, allowing source-drain modulation. Under a certain forward bias, an accumulated interface is formed within quantum well region 13, which will enhance channel conduction.

Highly doped thin layer 14, which is termed a charge sheet layer is formed within wide bandgap region 15 and near the heterointerface of wide bandgap region 15 and quantum well region 13. The formation of the charge sheet is typically accomplished in part by charge deposition, such as molecular beam epitaxy (MBE), metal-organic vapor phase epitaxy (MOVPE) and the like. It is anticipated that the deposited charge is typically less than 100 Å from the heterointerface.

The typical thickness of the charge sheet is between 20 and 100 Å. Top layer 17 is a heavily doped narrow bandgap layer that facilitates the formation of ohmic contacts thereto. Highly doped cap layer 17 as well as refractory metallic layer 21 comprises the gate contact, which has a literal designation G. There are also electrical contacts 19 and 21 to the buried channel, comprising narrow bandgap quantum well 13 and intermediate bandgap layer 12, via highly doped regions 18. Those skilled in the art will recognize that contacts 21, 19 and the respective portions of doped regions 18 comprise the source (S) and drain (D) terminals for the field effect transistor, respectively. Additionally, layers 11, 14, 30, 31 and 17 have a first conductivity type and layer 12 has a second conductivity type.

In a particular embodiment, the GaAs/InGaAs/AlGaAs material system is chosen to illustrate the relative energy bandgaps of the device layers. It will be readily appreciated that other materials may be used from the Group III-V and Group II-VI semiconductor compounds. Furthermore, the dimensions given are typical only and for many purposes may be varied for optimization of the device characteristics with respect to the particular application contemplated.

Referring to FIG. 1, substrate 10 was semi-insulating GaAs, wide bandgap layer 11 was n-type $Al_{0.7}Ga_{0.3}As$ (4000 Å), intermediate bandgap layer 12 was p-type $Al_{0.1}Ga_{0.9}As$ (600 Å), and narrow bandgap quantum well 13 was a single quantum well of InGaAs (100 Å). The charge sheet 14 was ~80 Å thick and had a donor, i.e., n-type, doping level of approximately $5 \times 10^{18}$ cm$^{-3}$. Wide bandgap region 15 comprised n-type $Al_{0.7}Ga_{0.3}As$ layer 31 followed by n-type $Al_{0.1}Ga_{0.9}As$ layer 30, whereas cap layer 17 comprised heavily doped n+ GaAs.

The epitaxial layers of the structure are expediently grown by molecular beam epitaxy. This growth technique is well known to those skilled in the art and need not be described in detail. It appears to be the preferred growth technique because of the control it affords over layer thickness and compositions. Other grown techniques are, however, contemplated, such as vapor phase epitaxy (VPE), liquid phase epitaxy (LPE) and the like.

After growth, refractory metal gate contact 21 is deposited and, then, utilizing the gate metal as a mask, an etching is performed to within 2000 Å of the heterointerface. The drain and source regions 18 are formed by ion-implanting the structure, such as by Mg+ ions, and then flash-annealing the structure at 950° C. for 10 seconds. It should be noted that heavily doped drain and source regions 18 are self-aligned with the gate region. The device is isolated by further etching an mesa to substrate 10.

It is understood that the lateral current flow is controlled by an externally applied vertical electrical field. The two ends of the channel having ohmic contacts thereto are known as the drain and source terminals through which the channel current flows. Contacts to the drain and source were made by using well-known and conventional lift-off techniques with Au/Zn. The underlying wide bandgap layer 11, that is the collector, may be contacted with AuGe/Ni/Au and used as a back gate contact 20 in order to adjust the threshold voltage in a manner analogous to substrate bias in the silicon technology. It should be noted that because the wide bandgap region 15 disposed above quantum well region 13 is n-type, the gate is isolated from the source and drain by p-n junctions and moreover, selfaligned thereto. Referring to FIG. 1, the channel length is determined by the distance between the source/drain p-n junction boundaries and, consequently, the effective channel length, $L_{eff}$ will always be less than the gate electrode length.

Figure 2:
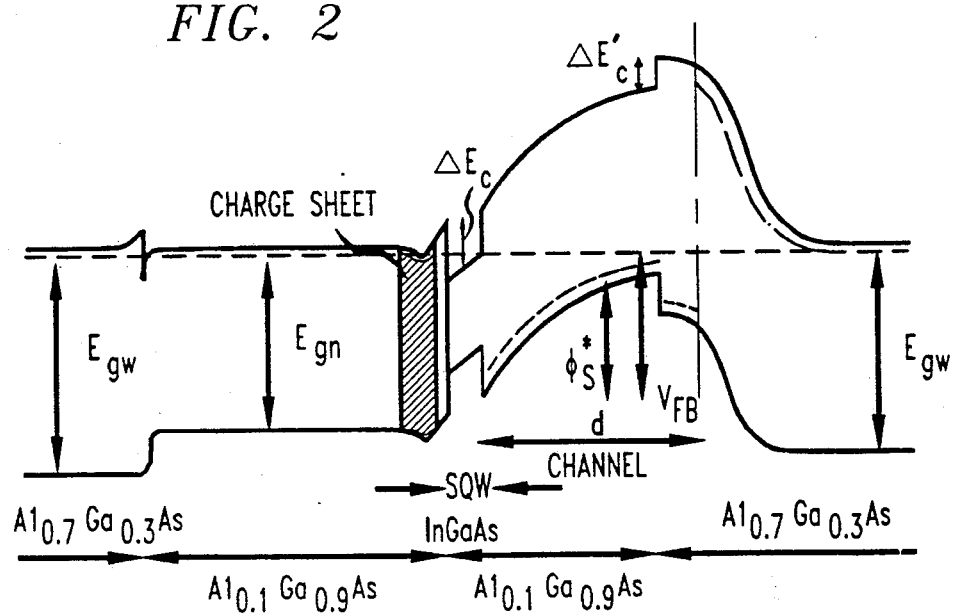
FIGS. 2-3 are energy band diagrams for the specific embodiment of the field effect transistor shown in FIG. 1.
Figure 3:
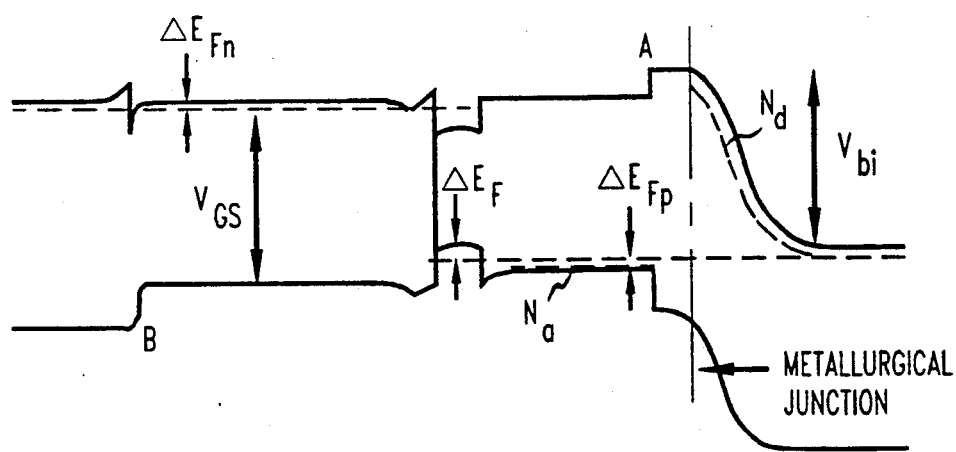
Figure 4:
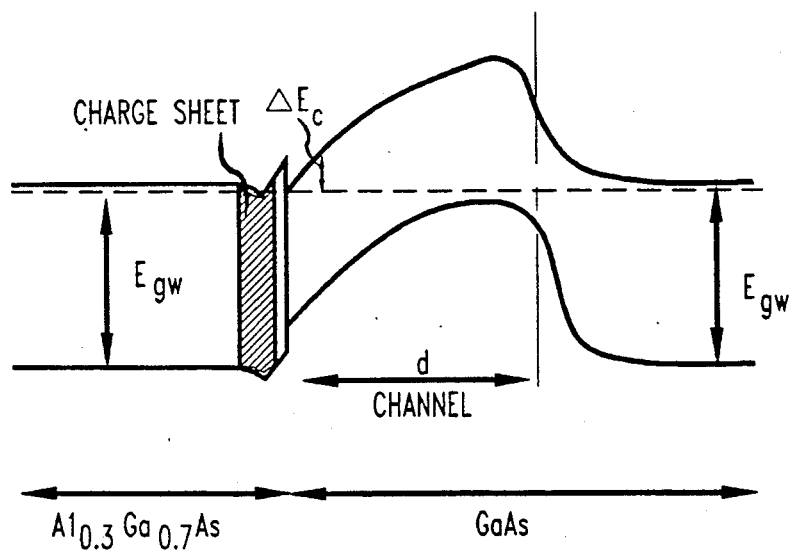
FIG. 4 is an energy band diagram for a non-quantum well, p-channel field effect transistor.

The device operation of the p-channel field effect transistor may be better understood by reference to the energy band diagrams depicted in FIGS. 2, 3 and 4. FIG. 4 shows the simple, non-quantum well case, while FIGS. 2 and 3 show the more complex quantum well case. It should be expressly noted that the theoretical analysis that follows is generally applicable to both types of devices, though the enhanced conduction due to accumulation in the quantum well will not be observed in the simple device. Furthermore, it is to be understood that the energy band diagrams depicted are not drawn to scale. FIGS. 2 and 3 show the zero bias and forward bias cases, respectively, for the quantum well case. In particular, FIG. 3 illustrates the device biased at the maximum gate bias, with both the source and collector terminals at ground potential. It should be noted that doped p-channel intermediate bandgap layer 12 becomes totally conductive as in metal semiconductor field effect transistors (MESFETs) or junction field effect transistors (JFETs). Under normal operating conditions, a reverse bias is applied across the p-n gate junctions so that free carriers are depleted from the channel, thereby increasing the effective resistance of the channel. Thus, the current flow between the source and the drain is modulated by the gate voltage. Importantly, the n-type charge sheet must be totally depleted. Under a large gate bias, the quantum well will become populated with holes, that is an accumulated interface results, and conduction therein enhances the transconductance of the device. Referring to FIG. 3, due to the potential barrier at B for holes and the potential barrier A for electrons, the accumulation of holes is possible without the onset of any significant gate conduction. It is anticipated that the maximum gate voltage that may be applied just below that of the energy bandgap of the wide bandgap layer 31, is typically 1.5 Volts for wide bandgap layer 15 being $Al_{0.3}Ga_{0.7}As$.

Figure 5:
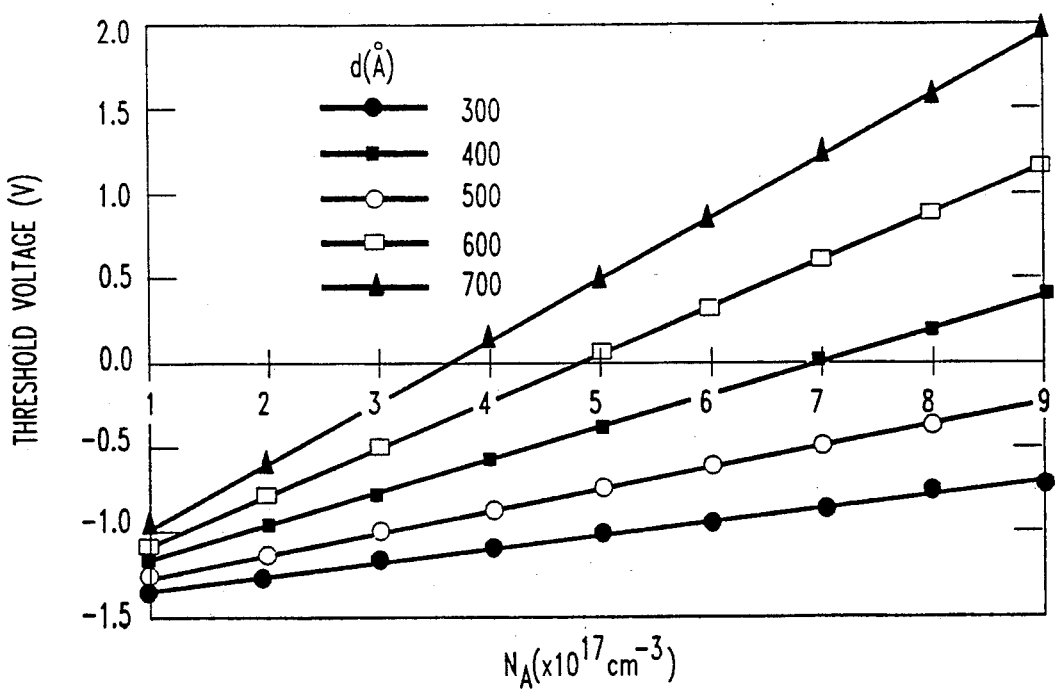
FIG. 5 is a graph illustrating the variation in the threshold voltage as a function of doping and thickness for the field effect transistor shown in FIG. 1.

From an examination of the energy band diagrams, the surface potential $\phi_s^*$ when the channel layer is fully depleted is given by:

$$\phi_s^* = \frac{qN_d d'^2}{2\epsilon}$$

$$d' = d - \frac{N_d}{N_a + N_d}\left\{\frac{2\epsilon}{q}\left[\frac{N_d}{N_a(N_a + N_d)}\right](V_{bi} + V_{cs})\right\}^{\frac{1}{2}}$$

where $N_d$ is the collector doping, $N_a$ is the narrow bandgap layer doping, d is the channel thickness, q is the electronic charge constant, $\epsilon$ is the permittivity, $V_{cs}$ is the collector to source bias and $V_{bi}$ is the built-in voltage of the channel-collector junction. The surface potential is effectively fixed until the channel has just become neutral at the metallurgical junction, which is at threshold or pinch-off. In particular, the flat-band voltage is given by $V_{fb}=E_{gn}-\Delta E_{Fp}-E_{Fn}$, where $E_{gn}$ is the bandgap of the p-doped channel. the threshold condition may be expressed as:

$$V_{TH} = \phi_s^* - V_{fb}$$

$$V_{TH} = \frac{qN_ad'^2}{2\epsilon} - E_{gn} + \frac{kT}{q} \ln \frac{N_v}{N_a}$$

where k is Boltzmann's constant, and $N_v$, is the density of states in the valence band. When $\phi < \phi_{sth}$, no conducting channel exists without an applied gate voltage, and thus the device is an enhancement or normally off device. Furthermore, it is important to realize that the threshold voltage can be adjusted by varying the doping density of acceptors $N_a$, the doping density of donors $N_d$, and the channel thickness d such that wide values of both enchancement and depletion voltage threshold values may be obtained, as shown in FIG. 5.

It is further anticipated that the transconductance will be determined by the charge $Q_{ch}=qN_ad$ present in the channel. For long channel devices, the transconductance is given by $g_m=W/L\mu Q_{ch}$, where W is width of the gate. However, as the device channel becomes short, the transconductance approaches the value $Wv_sQ_{ch}/\phi_s^*$, where $v_s$ is the saturated drift velocity of the carriers and $\phi_s^*$ is the gate voltage required to achieve flat bands in the channel. It is contemplated that the transconductance will be enhanced because of the accumulation of holes at the heterointerface. For example, due to the discontinuity $\Delta E'_c$ between the narrow bandgap layer and the large bandgap layer, an additional gate voltage $\Delta V_g = q\Delta E'_c$ should be required before gate conduction becomes dominant. Just as flat-band conditions are reached, the Fermi level will move into the quantum well and result in an additional hole charge $Q_{qw}$ therein, which can be expressed as follows:

$$Q_{qw} = \frac{qm_p}{\pi h^2} kT \ln\{1 + e^{\frac{q}{k}(\Delta E_f - E_1)}\}$$

where $\Delta E_f$ represents the extent to which the Fermi level has moved into the quantum well, h is Planck's constant h divided by $2\pi$ and $E_1$ is the energy of the first quantized quantum well level. This increase in charge will result in an increase in the transconductance $$g_m = \frac{\partial I_{ds}}{\partial V_{gs}}$$

by an amount of $g'_m$ given by $$g'_m = Wv_s \frac{Q_{qw}}{\Delta V_g}$$

where $\Delta V_g$ is the additional gate voltage to achieve $\Delta E_f$ in the quantum well from the onset of quantum well population, and $m_p$ is the heavy hole mass.

Calculations indicate that a threshold voltage of $-0.3$ V, transconductance $g_m$ of 200 mS/mm and an additional transconductance of $g'_m$ of 250 mS/mm are obtained for the following parameters: $N_d \sim 5 \times 10^{16}$ cm$^{-3}$, $N_a \sim 5 \times 10^{17}$ cm$^{-3}$, $d \sim 600$ Å, $Q_{ch} \sim 4 \times 10^{-7}$ C/cm$^2$, $v_s \sim 5 \times 10^6$ cm/sec, $m_p \sim 0.45 m_o$, ($m_o$ is the rest mass of a hole), $\Delta V_g \sim 0.3$ V, and $\Delta E_f \sim 0.1$ eV. It should be noted that the transconductance and the threshold voltage are independently determined by the growth parameters of the quantum well and the doping concentration in the intermediate bandgap layer.

An additional advantage to the present invention involves the ability to fabricate complementary field effect transistors. It is anticipated that for low n-type doping levels, a complementary n-channel field effect transistor utilizing the principles of the invention can be fabricated by ionimplanting the entire structure. By implanting p-type dopants into the p-channel structure and thus converting all the regions above the charge sheet to a p conductivity type, n-channel heterojunction field effect transistors (HFETs) may be realized. For a discussion of a heterojunction field effect transistor, see, G. W. Taylor et al., *Electronics Letters*, Vol. 22, No. 15, pp. 77-9 (1986), which is incorporated herein by reference. Accordingly, complementary devices with low leakage current and independently controllable threshold voltages can be fabricated on a single substrate.

A further advantage to the present invention involves the ability to fabricate a laser incorporating the structure shown in FIG. 1. For high current levels, substantial recombination occurs which gives rise to strong electroluminescence. With formation of a suitable optical cavity, lasing action is obtained. Methods for forming the cavity, such as cleaving and thin film deposition, are well known in the art and need not not be described in detail. The cleaved surfaces or the surfaces with thin film deposited thereon form the optical cavity. Appropriate surfaces are the two vertical surfaces under the source and drain contacts in FIG. 1. As in the case for the field effect transistor, the laser utilizes highly doped charge sheet 14 at the heterointerface in order to effectively eliminate the depletion of n-type layer 30. It should be noted that the laser has a n-p-n structure, with the active layer being single quantum well 13. Importantly, the lasing action is confined vertically due to the higher refractive index of layers 30 and 12, which serve as upper and lower cladding regions, whereas lateral confinement is provided by p+ implanted regions 18. It is contemplated that layers 30 and 12 may be graded in order to obtain the advantages seen in graded index separate confinement heterostructure (GRINSCH) lasers.

In operation, lasing is achieved by forward biasing both the source and gate. Accordingly, electrons are pumped into quantum well 13 from both the collector and the gate, while holes are pumped laterally through the implant regions 18. It is anticipated that this device will exhibit low threshold currents. The development of a laser compatible with the complementary field effect transistors described above herein affords a monolithic complementary optoelectronic technology for high speed, low power optical computing.

It is understood that the embodiment herein is merely illustrative of the principles of the invention. Various other modifications may be made by those skilled in the art which will embody the principles of the invention and fall within the spirit and the scope thereof. For example, it is contemplated that the wide and narrow bandgap layer may comprise graded index ternary compounds and the like.

We claim:

1. A field effect transistor having a first semiconductor region laterally disposed between second and third semiconductor regions, said first semiconductor region comprising:
   a first semiconductor layer having a first conductivity type, a first energy bandgap and a first doping concentration;
   a second semiconductor layer forming a conducting channel between said second and third semiconductor regions, said second and third semiconductor regions each having a second conductivity type opposite to said first conductivity type, said second semiconductor layer having said second conductivity type and a second energy bandgap, said first energy bandgap greater than said second energy bandgap, and said first and second semiconductor layers having a first heterojunction interface such that said conducting channel is formed beneath said first heterojunction interface;
   a charge sheet formed within said first semiconductor layer and substantially near said first heterojunction interface, said charge sheet having said first conductivity type and a second doping concentration substantially greater than said first doping concentration; and
   a third semiconductor layer having said first conductivity type and a third energy bandgap substantially equal to said first energy bandgap, said second and third semiconductor layers having an interface.

2. A field effect transistor having a first semiconductor region laterally disposed between second and third semiconductor regions, said first semiconductor region comprising;
   a first semiconductor layer having a first conductivity type, a first energy bandgap and a first doping concentration;
   a second semiconductor layer having a second conductivity type and a second energy bandgap, said second conductivity type opposite to said first conductivity type, said first energy bandgap greater than said second energy bandgap;
   a quantum well formed within said second semiconductor layer having a third energy bandgap less than said second energy bandgap, said quantum well having first and second heterojunction interfaces between said first and second semiconductor layers, respectively, and said second semiconductor layer in combination with said quantum well forming a conducting channel between said second and third semiconductor regions such than said conducting channel is formed beneath said first heterojunction interface, said second and third semiconductor regions each having said second conductivity type;
   a charge sheet formed within said first semiconductor layer and substantially near said first heterojunction interface, said charge sheet having said first conductivity type and a second doping concentration substantially greater than said first doping concentration; and
   a third semiconductor layer having said first conductivity type and a fourth energy bandgap, and fourth energy bandgap substantially equal to said first energy bandgap, and said second and third semiconductor layers having an interface.

3. A field effect transistor according to claims 1 or 2 wherein said charge sheet is within 100 Å from said first heterojunction interface.

4. A field effect transistor according to claim 3 wherein said charge sheet has a doping concentration within the range from approximately $10^{17}/cm^3$ to approximately $10^{19}/cm^3$.

5. A field effect transistor according to claim 4 wherein said second semiconductor layer has a P-type conductivity type.

6. A field effect transistor according to claim 5 wherein said charge sheet has a donor doping concentration of approximately $5 \times 10^{18}/cm^3$.

7. A field effect transistor according to claim 6 further comprising first, second and third electrical contacts to said first, second and third semiconductor regions, respectively.

8. A field effect transistor according to claim 7 further comprising a fourth electrical contact to said third semiconductor layer.

9. A field effect transistor according to claim 2 wherein said first, second and third layers, and said quantum well are selected from Group III-V semiconductors or II-VI semiconductors.

10. A field effect transistor according to claim 9 wherein said quantum well is InGaAs, and said first, second and third semiconductor layers are AlGaAs.

11. In a semiconductor laser having a first semiconductor region laterally disposed between second and third semiconductor regions, said first semiconductor region comprising:
    a first semiconductor layer having a first conductivity type, a first energy bandgap, and a first doping concentration;
    a second semiconductor layer having a second conductivity type and a second energy bandgap, said second conductivity type opposite to said first conductivity type, said first energy bandgap greater than said second energy bandgap;
    a quantum well formed within said second semiconductor layer having a third energy bandgap less than said second energy bandgap, and said second semiconductor layer in combination with said quantum well forming a conducting path between said second and third semiconductor regions, said quantum well having first and second heterojunction interfaces between said first and second semiconductor layers, respectively, said second and third semiconductor regions each having said second conductivity type;
    a charge sheet formed within said first semiconductor layer and substantially near said first heterojunction interface, said charge sheet having said first conductivity type and a second doping concentration substantially greater than said first doping concentration; and
    a third semiconductor layer having said first conductivity and a fourth energy bandgap, said fourth energy bandgap substantially equal to said first energy bandgap, and said second and third semiconductor layers having an interface.

12. A laser according to claim 11 wherein said charge sheet is within 100 Å from said first heterojunction interface.

13. A laser according to claim 12 wherein said charge sheet has a doping concentration within the range from approximately $10^{17}/cm^3$ to approximately $10^{19}/cm^3$.

14. A laser according to claim 13 wherein said second semiconductor layer has a P-type conductivity type.

15. A laser according to claim 14 wherein said charge sheet has a donor concentration of approximately $5 \times 10^{18}/cm^3$.

16. A laser according to claim 13 further comprising first, second and third electrical contacts to said first, second and third semiconductor regions, respectively.

17. A laser according to claim 16 further comprising a fourth electrical contact to said third semiconductor layer.

18. A laser according to claim 16 wherein said first, second and third semiconductor layers, and said quantum well are selected from Group III-V semiconductors or II-VI semiconductors.

19. A laser according to claim 18 wherein said quantum well is InGaAs, and said first, second and third semiconductor layers are AlGaAs.

* * * * *